United States Patent
Li et al.

(10) Patent No.: US 8,728,575 B2
(45) Date of Patent: May 20, 2014

(54) METHOD FOR SYNTHESIZING A THIN FILM

(76) Inventors: Xuesong Li, Yorktown Heights, NY (US); Yu-Ming Lin, West Harrison, NY (US); Chun-Yung Sung, Poughkeepsie, NY (US)

( * ) Notice: Subject to any disclaimer, the term of this patent is extended or adjusted under 35 U.S.C. 154(b) by 0 days.

(21) Appl. No.: 13/475,167

(22) Filed: May 18, 2012

(65) Prior Publication Data
US 2013/0309402 A1 Nov. 21, 2013

(51) Int. Cl.
*C23C 16/26* (2006.01)
*C23C 16/34* (2006.01)

(52) U.S. Cl.
USPC .............. 427/248.1; 427/249.1; 427/255.394; 427/255.5

(58) Field of Classification Search
USPC ................. 427/248.1, 249.1, 249.3, 255.394, 427/255.5
See application file for complete search history.

(56) References Cited

U.S. PATENT DOCUMENTS

2007/0231010 A1* 10/2007 Ohta et al. ..................... 399/168
2010/0196591 A1* 8/2010 Hein et al. ...................... 427/74
2010/0261058 A1* 10/2010 Lopatin et al. ................. 429/212
2011/0091647 A1 4/2011 Colombo et al.
2011/0180478 A1* 7/2011 Shah et al. ..................... 210/638
2011/0315657 A1* 12/2011 Cho et al. ......................... 216/36

OTHER PUBLICATIONS

Levendorf, Mark P., et al., "Graphene and boron nitride lateral heterostructures for atomically thin circuitry". Nature, vol. 488, Aug. 30, 2012, pp. 627-632.*
Verma, Ved Prakash, et al., "Large-area graphene on polymer film for flexible and transparent anode in field emission device". Applied Physics Letters, 96, 203108 (2010), pp. 1-3.*
Oshima, Chuhei, et al., "Ultra-thin epitaxial films of graphite and hexagonal boron nitride on solid surfaces". J. Phys.: Condens. Matter 9 (1997) 1-20.*
Xuesong Li et al., Large-Area Synthesis of High-Quality and Uniform Graphene Films on Copper Foils, Science, vol. 324, pp. 1312-1314, Jun. 5, 2009, www.sciencemag.org.
Sukang Bae et al., Roll-to-Roll production of 30-inch graphene films for transparent electrodes, Nature Nanotechnology, vol. 5, pp. 574-578, Aug. 2010, Published on line: Jun. 20, 2010, dol:10.1038/NNAN0.2010.132, www.nature.com/nanotechnology.

* cited by examiner

*Primary Examiner* — Bret Chen

(57) ABSTRACT

A method for synthesizing a thin film, the method containing the steps of: (a) providing a substrate support assembly containing at least two selectively interdigitable substrate support fixtures; (b) loading a substrate for thin film synthesis onto said at least two fixtures; (c) interdigitating said at least two fixtures; (d) positioning said at least two fixtures in a reaction chamber and forming a thin film on a surface of the substrate; and (e) unloading the substrate from said at least two fixtures.

6 Claims, 9 Drawing Sheets

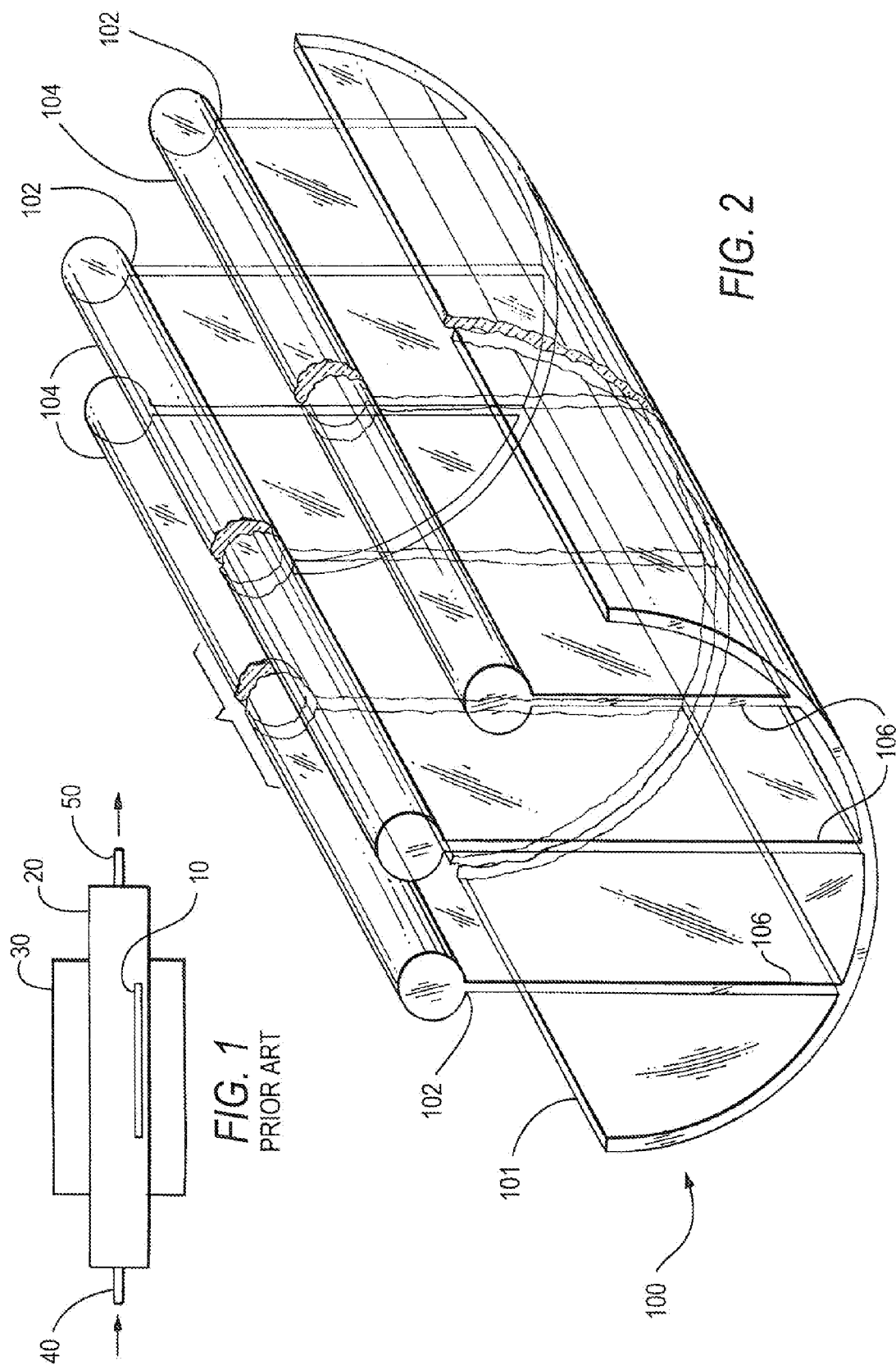

METHOD FOR SYNTHESIZING A THIN FILM

TECHNICAL FIELD

The present invention relates broadly to the production of films via chemical vapor deposition, and in particular, to methods and apparatus for forming carbon films and other films using such deposition. More specifically, this invention relates to a substrate support assembly for processing and heating a substrate in a reactor chamber in order to form a large area thin film having an augmented width dimension.

BACKGROUND OF THE INVENTION

Graphene and boron-nitride films are examples of useful large area thin films that may be beneficially produced using the methods and apparatus of the present invention. The invention is particularly useful in the synthesis of graphene, which is a one-atom thick, two-dimensional planar sheet or monolayer in which carbon atoms are bonded in a stable extended fused array, comprising polycyclic aromatic rings with covalently bonded carbon atoms having $sp^2$ orbital hybridization. The covalently bonded carbon atoms are densely packed in a honeycomb crystal lattice, and may form a 6-membered ring as the basic repeating unit, but 5-membered rings and/or 7-membered rings may also be formed. Graphene has distinctive electrical, mechanical and chemical properties that make it attractive for applications in flexible electronics. For example, electrons may move on a graphene sheet as though they have zero mass, and thus may move at the velocity of light.

Graphene may be formed on the surface of a substrate by a variety of methods. An exemplary but promising method is set forth in U.S. Patent Application Publication No. 2011/0091647 (the disclosure of which is incorporated by reference herein in its entirety), in which graphene may be produced using a chemical vapor deposition (CVD) process. In general, CVD is a process by which a thin film layer is deposited onto a substrate. The substrate is supported in a vacuum deposition process chamber, and the substrate is heated to a high temperature, typically several hundred degrees Celsius. Deposition gases are then injected into the chamber, and are thermally activated such that a chemical reaction takes place by which a thin film layer is deposited onto the substrate. The substrate on which the thin film layer has been deposited is then cooled to room temperature, after which the thin film layer may be separated from the substrate.

The aforementioned U.S. Patent Application Publication No. 2011/0091647 discloses a CVD process by which graphene may be formed on a metallic substrate such as copper foil, which is heat-treated in the presence of a gaseous carbon source, specifically, a mixture of a hydrocarbon gas and hydrogen gas. The metallic substrate is loaded into a tube furnace, usually comprising a cavity where the heat treatment is carried out at a specified temperature; the cavity is generally surrounded by heating elements and is in fluid communication with the gaseous sources. It is believed that during the treatment, some of the heated hydrogen gas disassociates into atomic hydrogen, which then reacts with the hydrocarbon gas, typically methane, to form one or more carbon growth species that, when they come into contact with the slightly cooler metallic substrate, form a deposit on the substrate as an thin carbon film (graphene). After a specified period of time the heat treatment is terminated, and the furnace, along with the coated substrate, is then cooled to room temperature, after which the thin film may used directly, with the substrate still attached, or may be separated or transferred from the substrate in a known manner, and then used.

In a similar manner, thin films of boron-nitride can be obtained by CVD, from precursors such as boron trichloride or boron tribromide and either nitrogen or a source of nitrogen such as ammonia, using a metallic foil substrate. Moreover, in addition to utilizing conventional CVD, graphene films, boron-nitride films and other large area thin films can alternatively be produced using other related processes, such as plasma-enhanced CVD (PECVD), as well as by using similar processes such as atomic layered deposition (ALD).

In each of these production techniques, the size (i.e., the surface area) of the thin film that is produced is determined by the size of the substrate on which it is grown, and the latter is limited, in turn, only by the dimensions of the reactor chamber or cavity of the CVD apparatus that is used. In general, that chamber is a horizontally-oriented cylindrical quartz tube, and the dimensions of the substrate which may be used are circumscribed by the dimensions of the chamber—the length of the substrate, which is defined as the dimension parallel to the axis of the cylindrical chamber, is determined by the length of that portion of the chamber which can be heated (that is, by the length of the heating zone of the furnace), and the width of the substrate, which is defined as the dimension perpendicular to the length and which is parallel to a radial dimension of the cylindrical chamber, is determined by the diameter of the chamber (that diameter being about equal to the maximum substrate width that can be obtained when the conventional technique of placing a flat sheet of the substrate into the cylindrical chamber is utilized). Although there are relatively few technical difficulties involved in manufacturing very long quartz tubes, and in manufacturing tube furnaces that would accommodate such tubes, the difficulty in manufacturing larger diameter quartz tubes increases dramatically with the increase in diameter of the tube. In addition, the connections between the quartz tube and the surrounding metal parts become more problematic with increased diameters because the manufacturing errors in the size and/or roundness of the quartz tube become magnified. Therefore, there are practical limits as to the diameter of the quartz tube reactor chamber, which in turn limit the width of the substrate that may be utilized therein.

Accordingly, a technique by which to load a metallic foil substrate into the quartz tube reactor chamber, such that the width of the substrate, and therefore the width of the thin film subsequently produced, can be increased dramatically despite the limits imposed by the diameters of presently-existing reactor chambers for CVD furnaces, would be a useful addition to the technology by which such films are manufactured using CVD or similar processes. Yet, despite the existence and availability of CVD processes for many years, such a technique has eluded researchers.

Although efforts have been made in the prior art to provide such techniques, those efforts are not completely satisfactory. For example, the prior art includes a technique by which the substrate can be wrapped around a cylindrical holder, but this provides an increase in substrate width of only about three times that of the chamber diameter itself. Moreover, although the aforementioned U.S. Patent Application Publication No. 2011/0091647 appears to disclose that a copper foil substrate about 2 meters in width may be utilized in the production of graphene, thus implying that the graphene film produced could have a comparable width, it has been determined that a flat substrate of such a width dimension would not be workable as a practical matter, due to the manufacturing and other difficulties mentioned above that are associated with producing quartz tube reaction chambers of increased diameter.

It is therefore the principal object of the present invention to provide improved methods and apparatus for synthesizing large area thin films using a CVD or CVD-type furnace, in which the width dimension of the thin film produced may be greatly increased.

It is another object of the present invention to provide improved methods of supporting a substrate, and an improved substrate support apparatus for heating a substrate, in the reactor chamber of a CVD or CVD-type furnace.

SUMMARY OF THE INVENTION

These and other objects of the present invention are achieved by providing a substrate support assembly comprising at least two interdigitable substrate support fixtures, each fixture carrying at least one finger-like formation for engaging and positioning the substrate during the deposition process that creates the thin film. Illustratively, when each fixture carries at least three finger-like substrate engagement members, and when two such fixtures are interdigitated, the substrate may be positioned not only in between and around a total of six finger-like substrate engagement members, but also on the outside of each fixture, thus achieving a many-fold increase in the effective width of the substrate. The substrate support fixtures are also adapted to be joined or coupled with one another so as to secure the finger-like substrate engagement members in the interdigitaged position, and such that together the substrate support fixtures may be placed within the conventional cylindrical reaction chamber of a CVD or CVD-type furnace.

Thus, one aspect of the present invention generally concerns apparatus that are useful for substrate support. In one embodiment of this aspect, an apparatus for synthesizing a large area thin film using CVD is provided, the apparatus including a substrate support assembly comprising at least two interdigitable substrate support fixtures, each carrying at least one finger-like substrate engagement member.

In another embodiment of this aspect of the invention, an improved substrate support assembly for the synthesis of a large area thin film using CVD is provided, the substrate support assembly including at least two interdigitable substrate support fixtures, each carrying at least one finger-like substrate engagement member.

In yet another embodiment of this aspect of the invention, an improved apparatus for processing a substrate is provided, the apparatus including at least two interdigitable substrate support fixtures, each carrying at least one finger-like substrate engagement member.

In still another embodiment of this aspect of the invention, an improved CVD reactor is provided, the reactor including a reactor chamber consisting of a substrate support assembly comprising at least two interdigitable substrate support fixtures, each carrying at least one finger-like substrate engagement member.

Another aspect of the invention generally concerns improved methods for thin film synthesis. In one embodiment of this aspect of the invention, a method for synthesizing a large area thin film is provided, the method comprising the steps of positioning a substrate for large area thin film synthesis in a substrate support assembly comprising at least two interdigitable substrate support fixtures, each carrying at least one finger-like substrate engagement member such that the substrate is positioned in between and around the finger-like engagement members, and generating a large area thin film on the substrate via a CVD reaction.

In another embodiment of this aspect of the invention, a method of supporting a substrate in a processing chamber for depositing a large area thin film on the substrate is provided, the method comprising the steps of positioning the substrate in a substrate support assembly comprising at least two interdigitable substrate support fixtures, each carrying at least one finger-like substrate engagement member such that the substrate is positioned in between and around the finger-like engagement members, and generating a large area thin film on the substrate.

In yet another embodiment of this aspect of the invention, a method of supporting a substrate in a processing chamber for depositing a CVD coating on the substrate is provided, the method comprising the steps of positioning the substrate in a substrate support assembly comprising at least two interdigitable substrate support fixtures, each carrying at least one finger-like substrate engagement member such that the substrate is positioned in between and around the finger-like engagement members, and generating a CVD coating on the substrate.

BRIEF DESCRIPTION OF THE DRAWINGS

These and other aspects, features, objects and advantages of the present invention will become more apparent to those skilled in the art from the following detailed description of the presently most preferred embodiments thereof (which are given for the purposes of disclosure), when read in conjunction with the accompanying drawings (which form a part of the specification, but which are not to be considered as limiting its scope), wherein:

FIG. 1 is a diagrammatic view depicting the conventional process by which a thin film such as graphene is deposited on a surface of a substrate in the reactor chamber of a CVD device;

FIG. 2 is a schematic perspective view of a preferred embodiment of the interdigitable substrate support fixture of the present invention, in which three finger-like substrate engagement members are provided;

DETAILED DESCRIPTION OF THE PREFERRED EMBODIMENT

Figure 3:
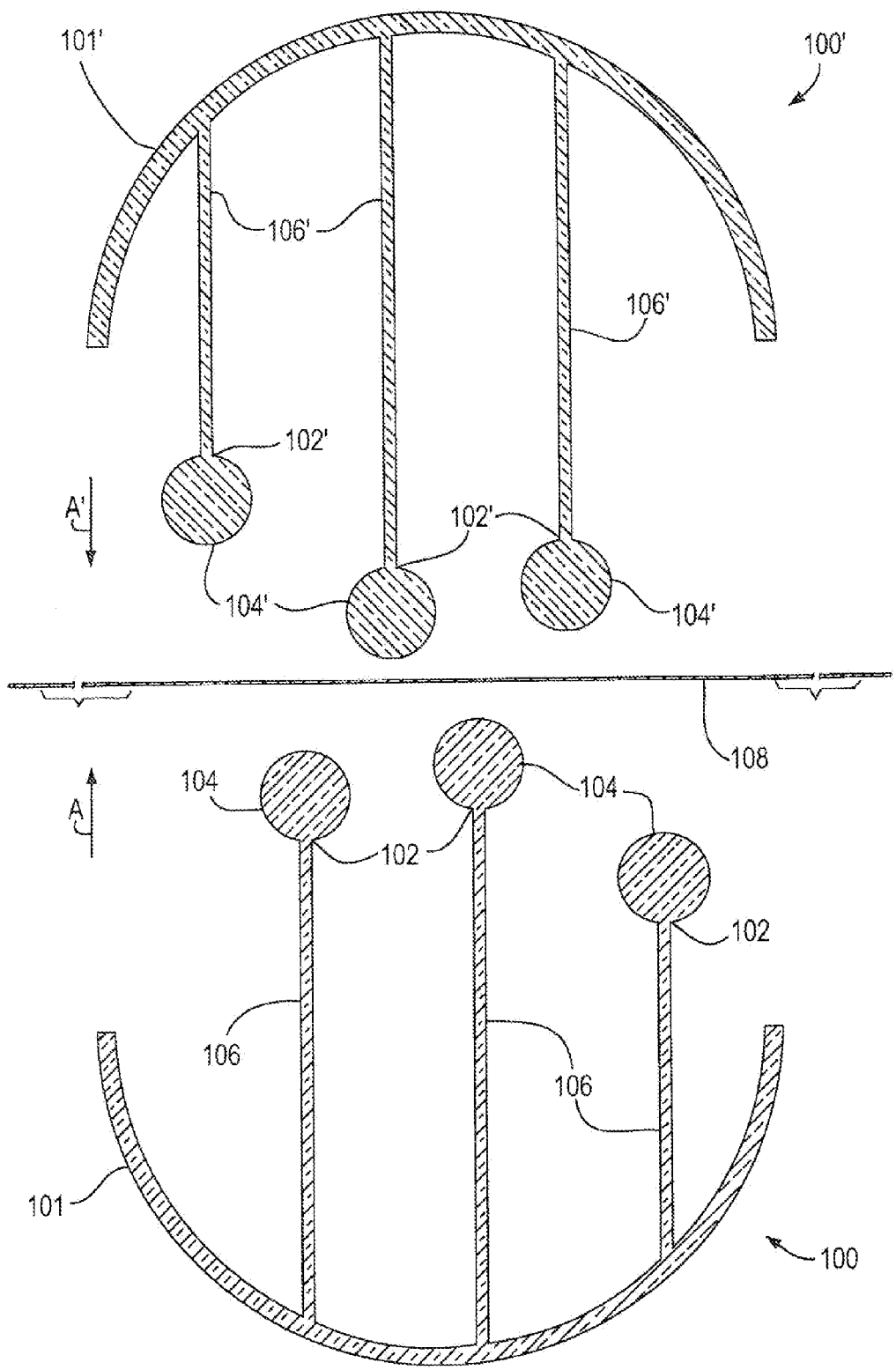
FIGS. 3-5 are enlarged schematic cross-sectional views, showing two of the fixtures of FIG. 2 and depicting the manner in which they may be brought together to form a preferred embodiment of the substrate support assembly of the present invention, as well as the manner in which a typical substrate may be loaded onto that substrate support assembly.

The preferred and other embodiments of the present invention will now be further described. Although the invention will be illustratively described hereinafter with reference to the formation of a large area graphene film on a copper foil substrate in a conventional CVD furnace, in the manner described generally in U.S. Patent Application Publication No. 2011/0091647, it should be understood that the invention is not limited to the specific case described, but extends also to the formation of boron-nitride and other large area thin films, utilizing other metallic foils (including nickel foils or aluminum foils) or other substrates, and using alternative vapor deposition processes such as PECVD or ALD.

Referring first to FIG. 1, the conventional prior art process by which a thin film such as graphene may be deposited on a surface of a flat substrate 10 in the reactor chamber 20 of a CVD furnace 30 having a gas inlet 40 and a gas outlet 50, in the manner described generally in U.S. Patent Application Publication No. 2011/0091647, is depicted diagrammatically, but for ease of illustration, the substrate holder, heating elements and other components of a conventional CVD furnace have been omitted. It is to be understood that, except for the substrate holder and the configuration of the substrate itself, the present invention utilizes the same conventional process.

Referring now to FIG. 2, a preferred embodiment of one of the interdigitable substrate support fixtures which comprise the substrate support assembly of the present invention is generally designated 100. Fixture 100 is preferably fabricated of quartz, as are each of its components as hereinafter described. Fixture 100 comprises a base member 101, which may be a "half-tube," i.e., generally semi-cylindrical in shape (semi-circular in cross-section). Fixture 100 further comprises at least one finger-like substrate engagement member 102 projecting from and extending radially inwardly from base member 101. Preferably, fixture 100 carries a plurality of engagement members 102 which are oriented generally parallel to one another, but the maximum number of engagement members (and the exact position of each engagement member) will depend on the diameter chosen for base member 101. For example, if the diameter of base member 101 is chosen to be 90 mm., then as shown for purposes of illustration in FIG. 2, preferably the maximum number of engagement members 102 will be three.

Each engagement member 102 comprises a tube or rod element 104 and a projecting plate member 106 which, at one edge, is affixed to and supports the associated tube or rod element 104, and which, at the opposing edge, is affixed to the base member 101. Preferably, each tube or rod element 104 has a diameter ranging from approximately 10 mm. to approximately 25 mm., and the thickness of each plate member 106 ranges from 2 mm. to 4 mm. The distance between adjacent engagement members 102 in each fixture 100 will depend on the diameter chosen for the tube or rod elements 104 that form a part of each engagement member, but should be chosen so that the engagement members 102 of a first fixture 100 may be selectively mutually interdigitated with the engagement members 102' of a second fixture 100' of similar structure. The base member 101 of each fixture 100 is also adapted to be joined or coupled with the base member 101' of a second fixture 100', such that the two semi-cylindrical base members together form a substantially completed cylinder.

Figure 4:
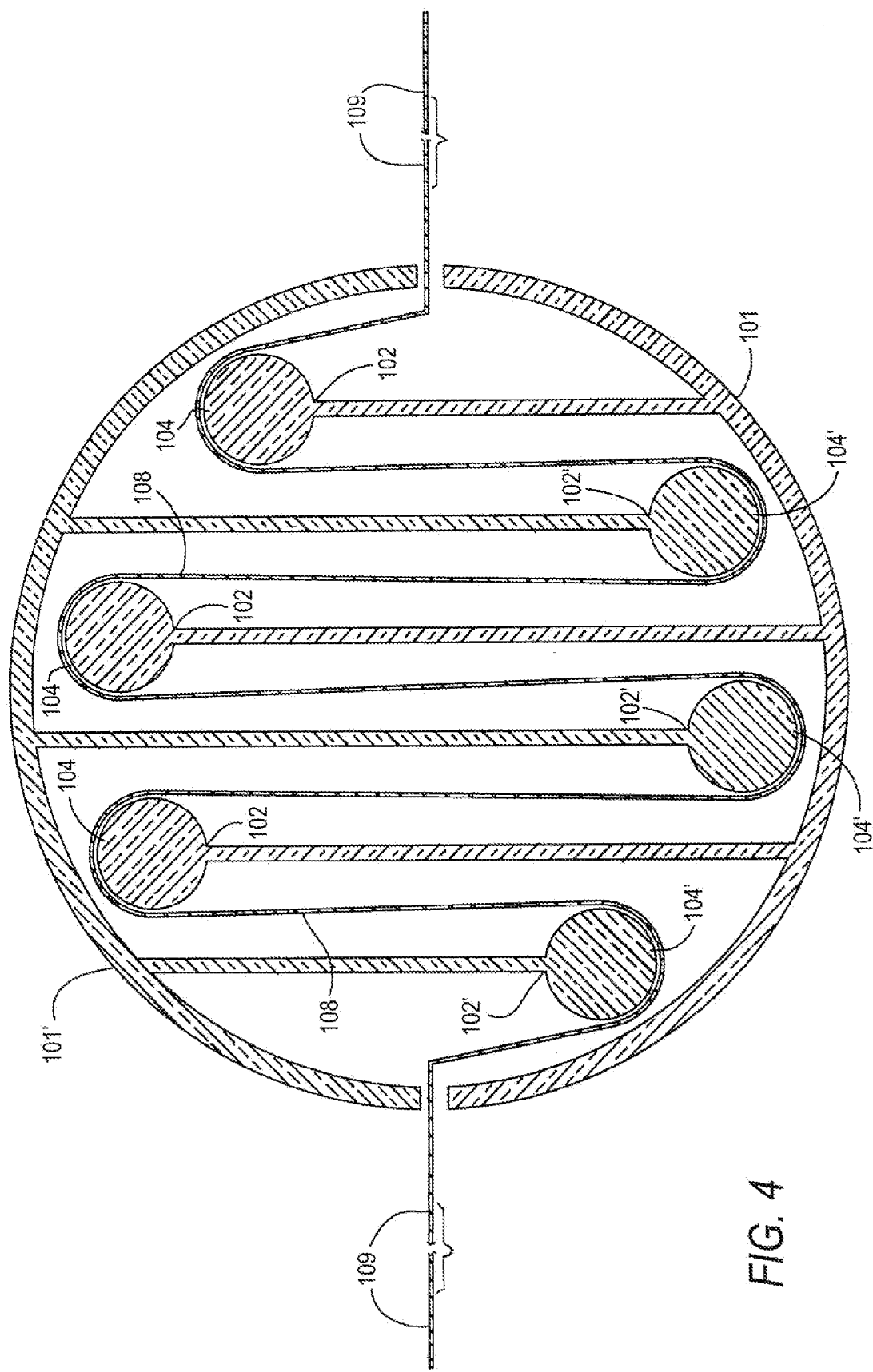
Figure 5:
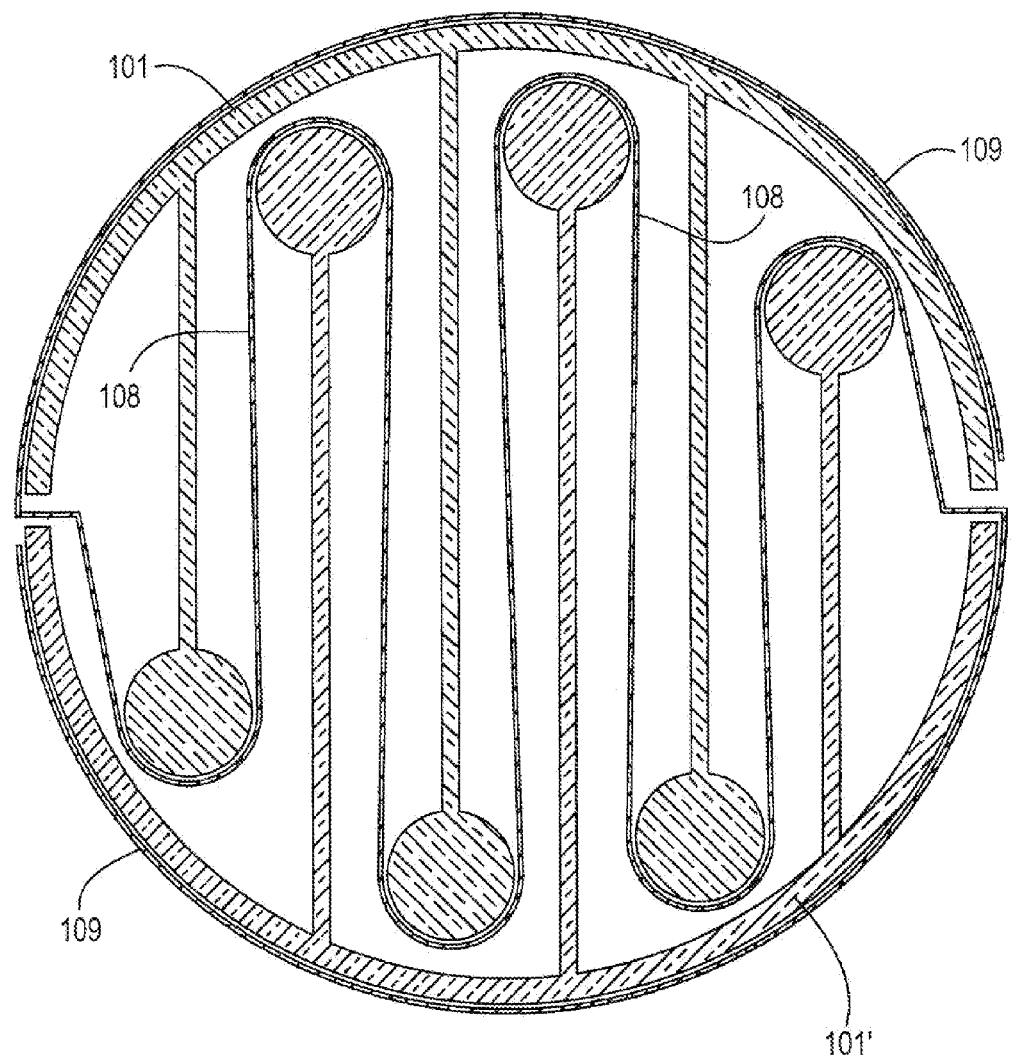

Referring now to FIGS. 3-5 in additional to the aforementioned FIGS. 1-2, two fixtures 100 and 100' may be brought together and joined or coupled with one another to form a substrate support assembly of the present invention. Engagement members 102 of the first fixture 100 are oriented so as to become interdigitated with the engagement members 102' of the second fixture 100', with sufficient clearance between adjacent interdigitated engagement members such that the tube or rod element 104 of each engagement member 102 of the first fixture 100 passes in between and does not collide with the tube or rod element(s) 104' of the adjacent engagement member(s) 102' of the second fixture 100', as shown best in FIGS. 3-4.

Furthermore, it will be understood that the length of the projecting plate members 106, 106' will not be uniform, but will vary from one engagement member 102 to another, and will be chosen so that, when two fixtures 100, 100' are joined or coupled with one another, and the substrate engagement members 102 of the first fixture 100 are interdigitated with the substrate engagement members 102' of the second fixture 100', the tube or rod elements 104 of fixture 100 extend to within 1-5 millimeters of, but do not touch, the opposing base member 101' of fixture 100', and similarly, the tube or rod elements 104' of fixture 100' extend to within 1-5 millimeters of, but do not touch, the opposing base member 101 of fixture 100, all as shown best in FIG. 4.

FIGS. 3-5 also illustrate the manner in which a substrate such as copper foil 108 may be loaded onto the illustrative embodiment of the substrate support assembly of the present invention. As shown in FIG. 3, a copper foil substrate 108 is oriented in a generally planar fashion, with one substrate support fixture 100 positioned alongside (or above) one surface of the foil, and with the other substrate support fixture 100' positioned alongside (or below) the opposite surface of the foil. Thereafter the fixtures 100, 100' are moved in the direction of the arrows A, A' in FIG. 3, and may be brought together and joined or coupled, either by hand or using tools, to form the substrate support assembly, and as they are brought together and become interdigitated, the copper foil substrate 108 is caused to be wrapped around and engaged by the tube or rod element 104, 104' of each of the engagement members 102, 102'. If the width of copper foil substrate 108 is chosen so as to exceed the diameter of fixtures 100, 100', then only the central portion of foil 108 becomes wrapped around and engaged by the tube or rod elements 104, 104' of engagement members 102, 102', while the two end portions 109 of copper foil substrate 108 extend, on both sides, through and beyond the juncture of fixtures 100, 100', as shown best in FIG. 4. Thereafter, preferably the entire substrate support assembly (that, is the joined fixtures 100, 100') is rotated by substantially 180 degrees, so that each end portion 109 of substrate 108 becomes wrapped around the curved exterior surface of base members 101, 101' of fixtures 100, 100', respectively. This configuration is preferred, since it maximizes the width of the graphene film that can be produced.

It is to be understood, however, that both the position of, and the width chosen for, the copper foil substrate 108 will affect whether, and the extent to which, a portion thereof will be wrapped around the curved exterior surfaces of base members 101, 101' of respective fixtures 100, 100'. For example, the copper foil substrate 108 can be positioned such that it extends through and beyond the juncture of fixtures 100, 100' on one side (either to the left or to the right, as seen in FIG. 4) but not on the other, and in such case, upon rotation of the substrate support assembly, the copper foil substrate 108 will ultimately be wrapped around the curved exterior surface of only one of base members 101, 101' of fixtures 100, 100'. Also by way of example, if the copper foil substrate 108 is positioned as shown in FIG. 3, but the width chosen for the foil is not as great as that shown in FIG. 3, but still exceeds the diameter of fixtures 100, 100', then upon rotation of the substrate support assembly the substrate 108 will be wrapped only part way around the curved exterior surfaces of base members 101, 101' of fixtures 100, 100'. As a further example, if the width chosen for the foil is substantially equal to the diameter of fixtures 100, 100', then upon rotation the substrate 108 will not be wrapped around the curved exterior surfaces of base members 101, 101' of fixtures 100, 100' at all.

Figure 6:
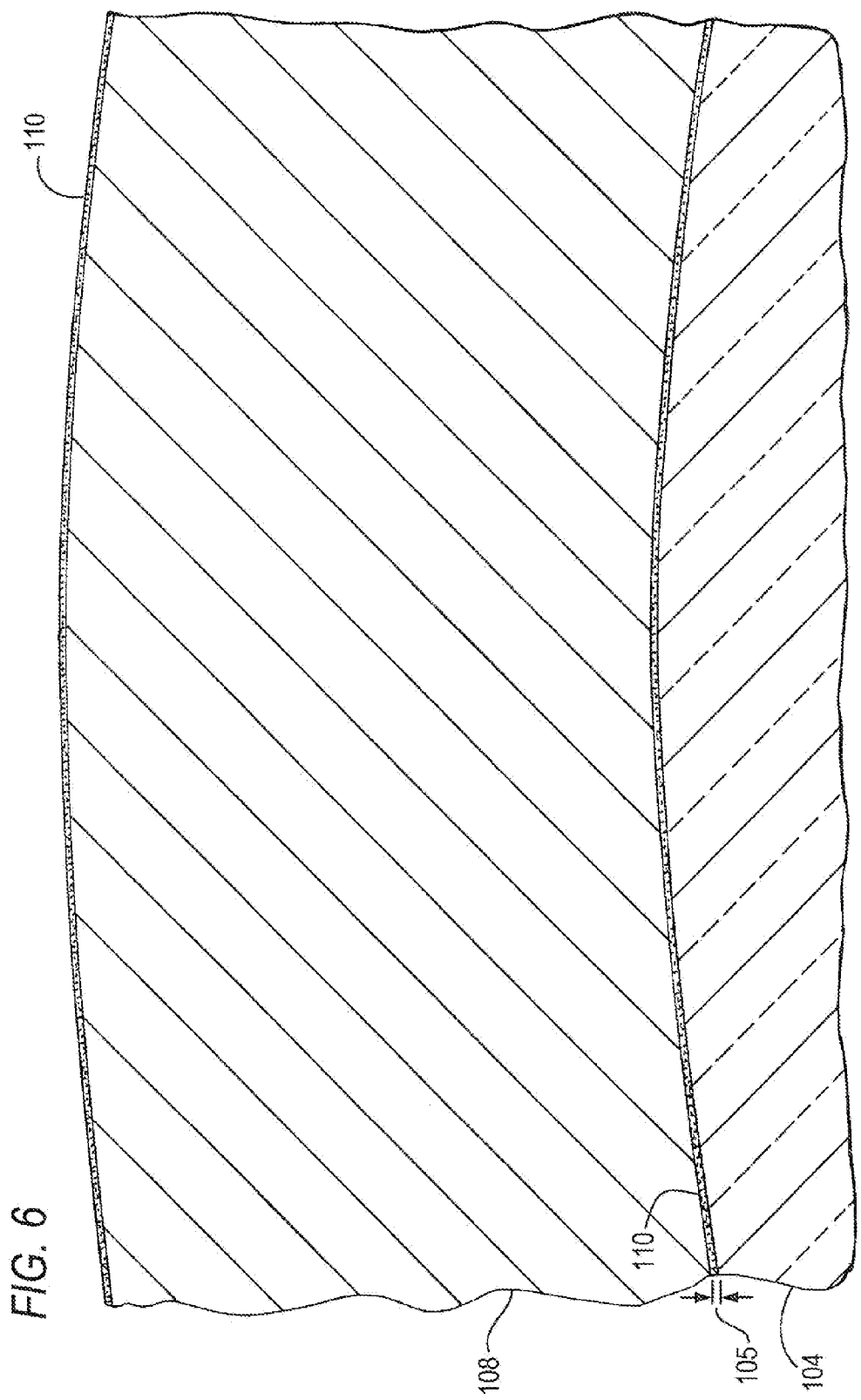
FIG. 6 is a greatly enlarged schematic cross-sectional view of a portion of the substrate positioned adjacent the curved portion of one of the finger-like substrate engagement members following the deposition of a thin film on to both surfaces of the substrate.

In addition, and referring now to FIG. 6 in addition to the aforementioned FIGS. 1-5, although the copper foil substrate 108 is wrapped around the respective tube or rod elements 104 of engagement members 102, 102' such that, to the naked eye, there does not appear to be a gap between the foil 108 and each tube or rod element 104, those of skill in the art will understand that a sub-microscopic gap 105 will always exist which will be sufficient to enable a one-atom thick graphene coating 110 to form during the CVD process on the surface of the copper foil substrate 108 that is proximal to the surface of each tube or rod element 104, as shown best in FIG. 6. Thus, when subjected to a CVD process, a continuous graphene coating 110 will be formed across the entire width, and on both surfaces of the substrate 108, even though the latter is wrapped around successive tube or rod elements 104 during the CVD process, as shown in FIG. 5.

Figure 7:
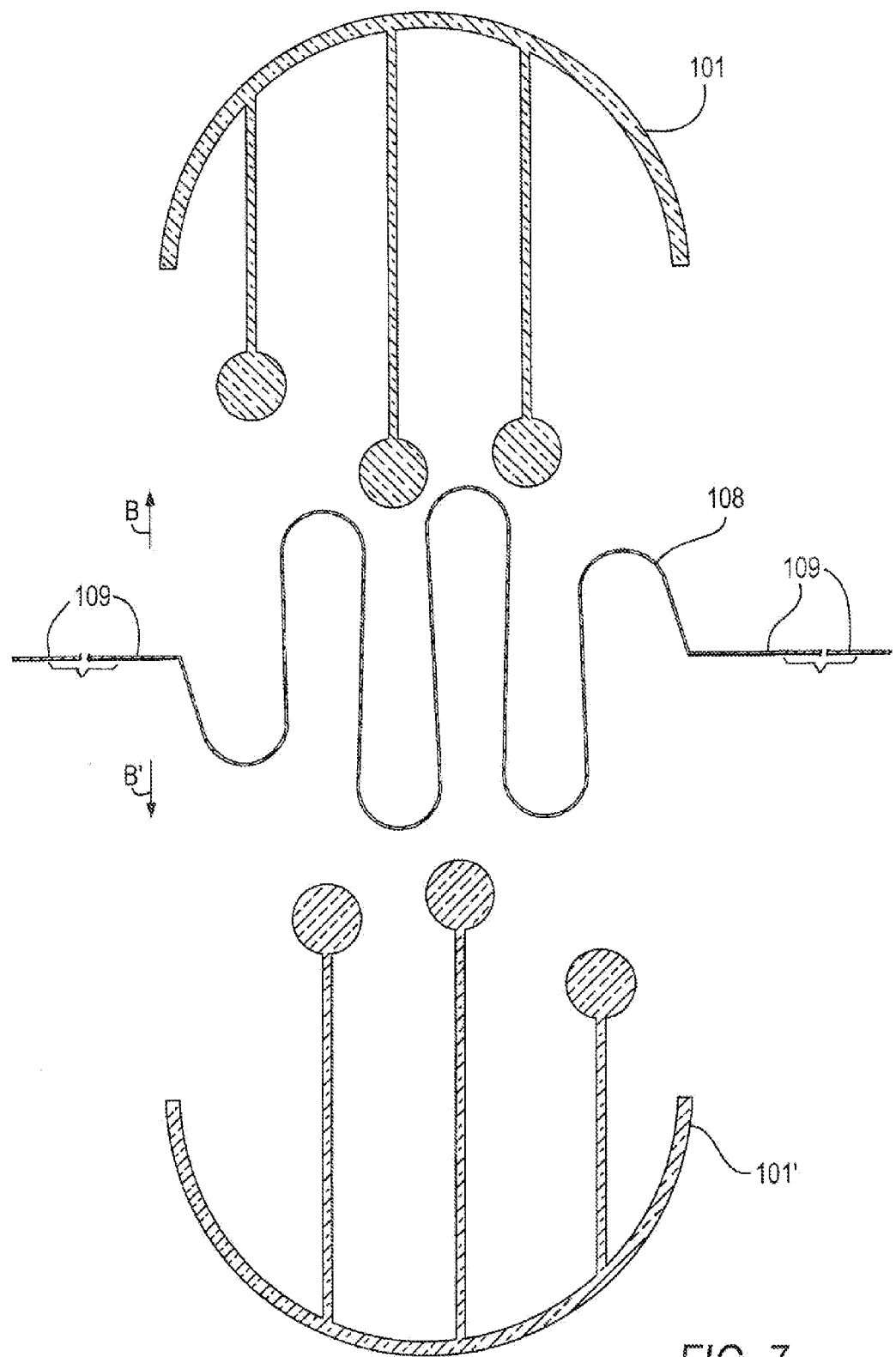
FIG. 7 is an enlarged schematic cross-sectional views, showing the manner in which a typical substrate may be unloaded from the substrate support assembly of FIGS. 3-5 after the deposition thereon of a thin film.
Figure 8:
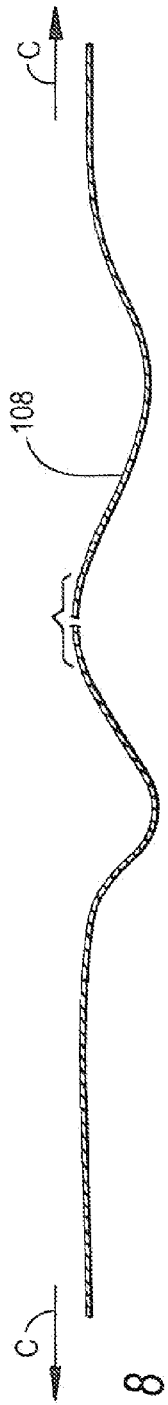
FIGS. 8-9 are schematic cross-sectional views showing the manner in which the a more planar shape may be imparted to the substrate upon which a thin film has been deposited.
Figure 9:
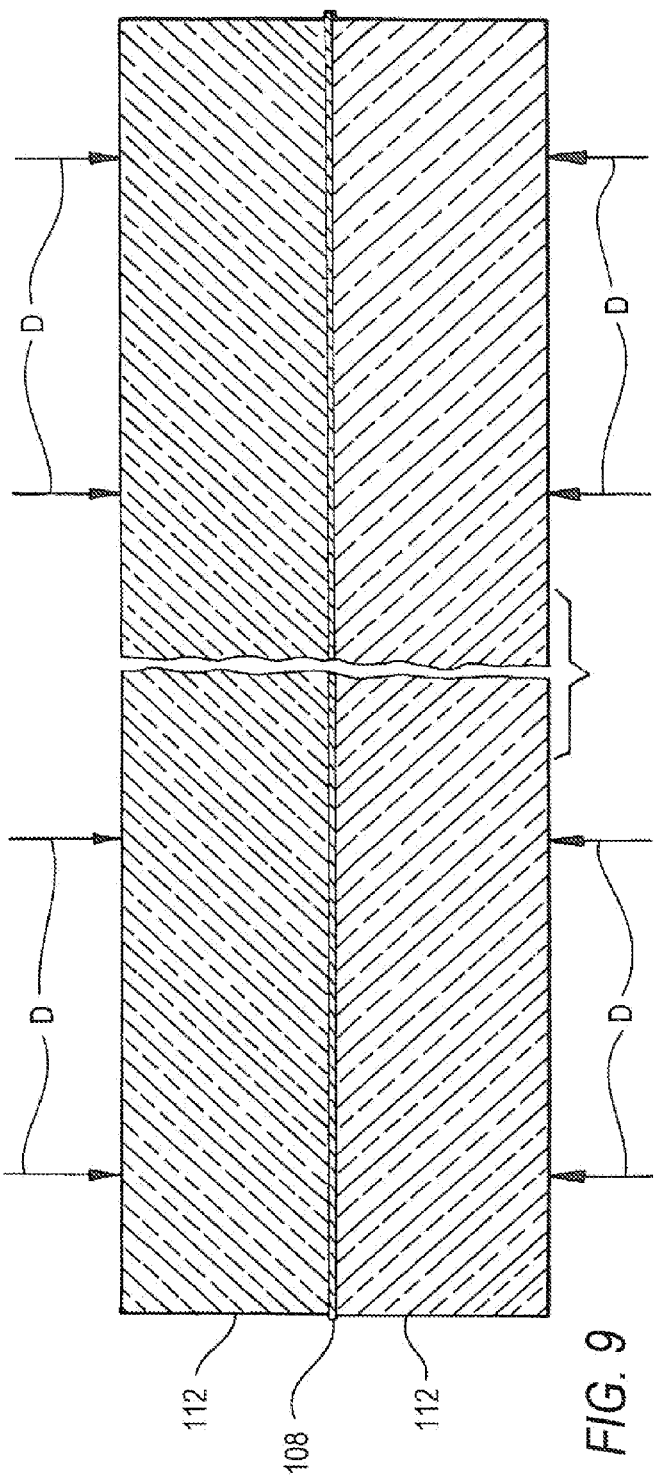

Referring now to FIGS. 7-9 in addition to the aforementioned FIGS. 1-6, it will be seen that FIG. 7 illustrates the manner in which the copper foil substrate 108 may be unloaded from the illustrative embodiment of the substrate support assembly of the present invention, following the deposition of a graphene coating using a CVD process. First, the ends 109 (if any) of the now-coated copper foil substrate are peeled and unwound from the curved exterior surfaces of base members 101 of fixtures 100, 100' (this step is not shown in the drawings). Then, fixtures 100 and 100' are disengaged from one another and are moved in the direction of arrows B, B' in FIG. 7, leaving the now-coated copper foil substrate 108 free. However, the now-coated copper foil substrate 108 will, in general, retain the undulating shape imparted by engagement members 102, 102' of fixtures 100, 100'. Thereafter, as illustrated in FIGS. 8-9, the ends of the now-coated copper foil substrate 108 may be pulled in opposite directions, as shown by the arrows C in FIG. 8, so as to impart a roughly planar shape. Finally, as shown in FIG. 9, the now-coated copper foil substrate 108 may be placed in between a pair of flattening members 112, each of which is preferably a plate made of glass, and the flattening members 112 may be urged in the directions shown by the arrows D in FIG. 9, so as to compress, and impart a more planar shape, to the coated substrate 108.

Following the flattening step illustrated in FIGS. 8-9, the graphene coating 110 may be separated or transferred from either or both surfaces of the copper foil substrate 108 in a known manner. For example, a salt solution which is an oxidizing agent may be used to exfoliate the graphene coating from the copper foil substrate, after which the separated graphene layers may be utilized in a graphene application or otherwise further processed for ultimate use.

As mentioned above, if the diameter of base member 101 is chosen to be 90 mm., then as shown in FIGS. 2-9, there will preferably be no more than three engagement members 102 in each fixture 100, 100', so that there will be six engagement members in total. In this case, after the two fixtures 100, 100' are joined or coupled to form a substrate support assembly, with the copper foil substrate 108 mounted therein as shown in FIG. 5, this substrate support assembly may be placed into a CVD furnace having a reactor chamber that is approximately 100 mm. in diameter. In this configuration, a copper foil substrate about 750 mm. in width may be used, and consequently, a graphene coating or layer that is about 750 mm. wide may be achieved, which is about 7.5 times the diameter of the CVD reactor chamber.

Figure 10:
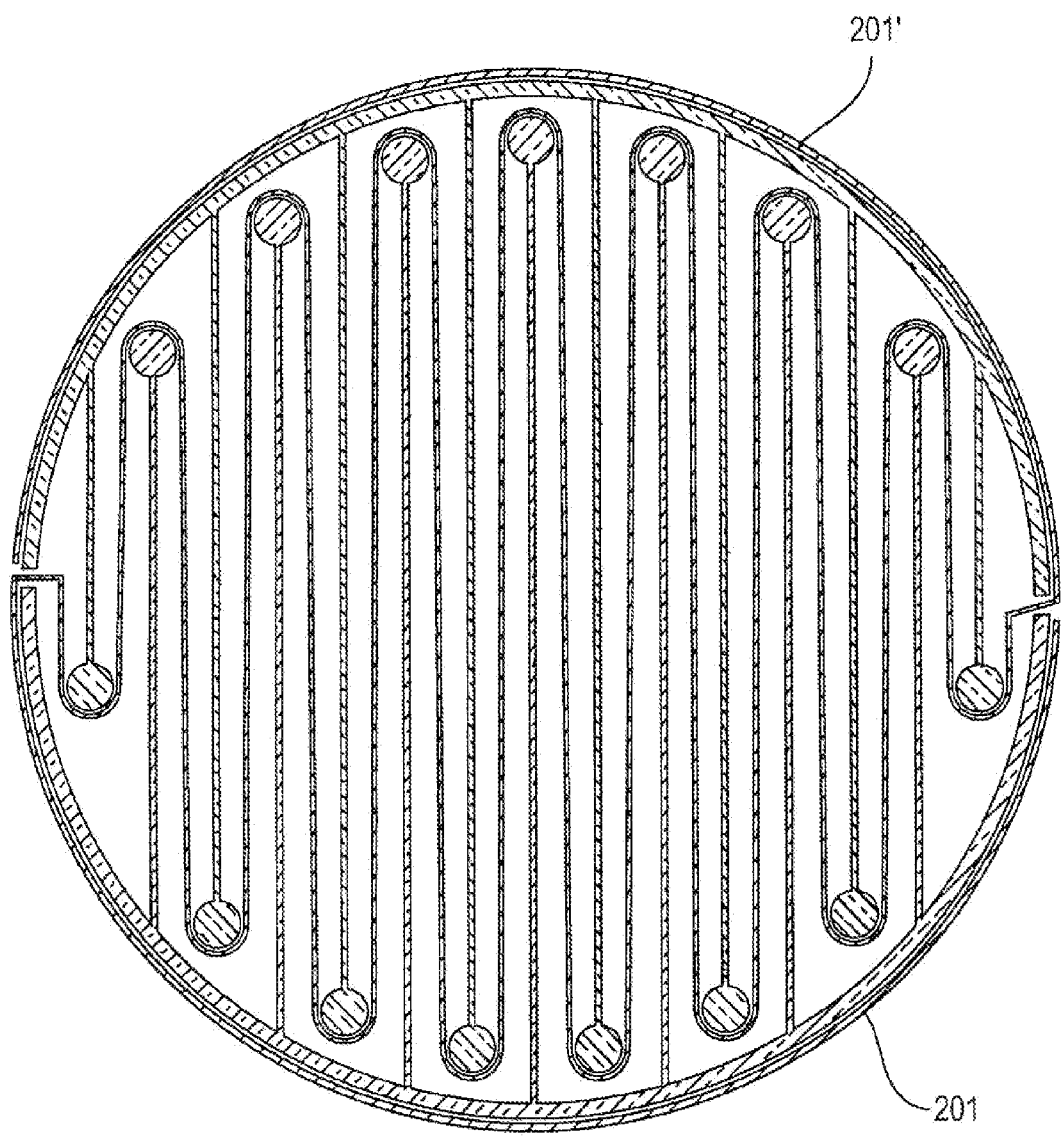
FIG. 10 is a schematic cross-sectional view of an alternative embodiment of the substrate support assembly of the present invention, in which a combined total of fifteen finger-like substrate engagement members are provided.

In an alternative embodiment of the invention, as shown in FIG. 10, if base members 201, 201', each with a diameter of 315 mm. is used, then a total of fifteen finger-like substrate engagement members can be accommodated, with eight engagement members in one fixture and seven engagement members in the other. In this case, after the two fixtures are joined or coupled to form a substrate support assembly, with the copper foil substrate mounted therein, this substrate support assembly can be placed into a CVD furnace with a reactor chamber that is approximately 330 mm. in diameter. In this configuration, a copper foil substrate that is about 3,000 mm. in width may be used, and consequently, a graphene coating or layer that is about 3,000 mm. wide may be achieved, which is more than nine times the diameter of the CVD reactor chamber. Hence, the invention provides methods and apparatus for forming graphene films and other thin films that have a greatly enhanced width dimension.

Figure 11:
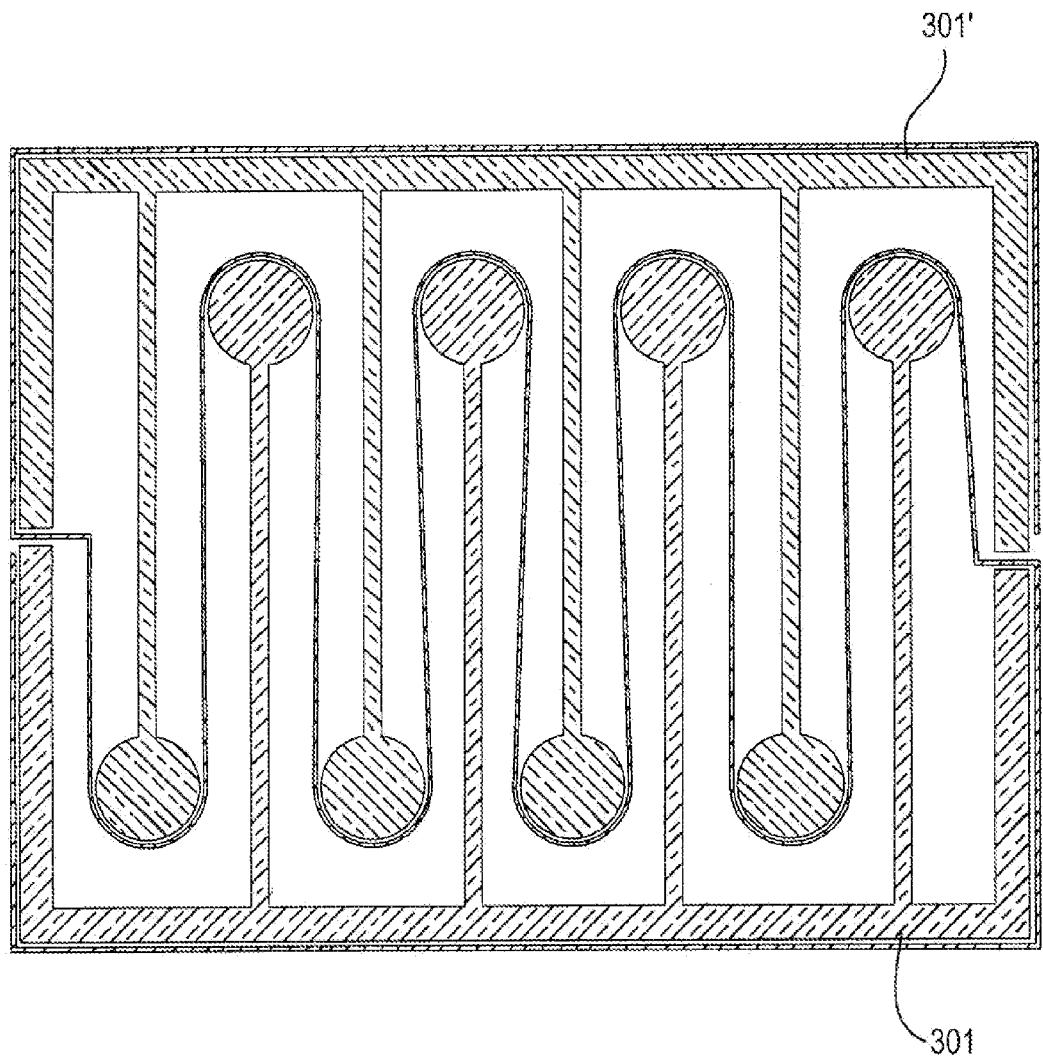
FIG. 11 is a schematic cross-sectional view of another embodiment of the substrate support assembly of the present invention, illustrating an alternative profile or shape.

Although the substrate support assembly of the invention has been described as having a cylindrical shape, it is to be understood that other shapes are possible. For example, as shown in FIG. 11, the base members 301, 301' of the substrate support fixtures may be configured such that, when they are brought together, the substrate support assembly of the invention has a rectangular cross-section. This profile uses the available space less efficiently, but on the other hand, it presents fewer manufacturing challenges.

While there has been described what are at present considered to be the preferred embodiments of the present invention, it will be apparent to those skilled in the art that the embodiments described herein are by way of illustration and not of limitation. Various modifications of the disclosed embodiments, as well as alternative embodiments of the invention, will become apparent to persons skilled in the art upon reference to the description of the invention. Therefore, it is to be understood that various changes and modifications may be made in the embodiments disclosed herein without departing from the true spirit and scope of the present invention, as set forth in the appended claims, and it is contemplated that the appended claims will cover any such modifications or embodiments.

The invention claimed:

1. A method for synthesizing a thin film, the method comprising the steps of
  (a) providing a substrate support assembly comprising at least two selectively interdigitable substrate support fixtures;
  (b) loading a substrate for thin film synthesis onto said at least two fixtures;
  (c) interdigitating said at least two fixtures;
  (d) positioning said at least two fixtures in a reaction chamber and forming a thin film on a surface of the substrate; and
  (e) unloading the substrate from said at least two fixtures;
  wherein each of said at least two fixtures comprises a base member and at least one interdigitable substrate engagement member;
  wherein said at least one interdigitable substrate engagement member comprises at least three interdigitable substrate engagement members;
  wherein the thin film is selected from the group consisting of graphene and boron nitride.

2. The method of claim 1 wherein said base member has a semicylindrical shape.

3. A method for supporting a substrate in a processing chamber for depositing a CVD coating, the method comprising the steps of
(a) providing a substrate support assembly comprising at least two selectively joinable and interdigitable substrate support fixtures;
(b) positioning said substrate on said at least two fixtures;
(c) joining and interdigitating said at least two fixtures;
(d) positioning said at least two fixtures in a processing chamber and depositing a CVD coating onto a surface of the substrate;
wherein each of said at least two fixtures comprises a base member and at least one interdigitable substrate engagement member;
wherein said at least one interdigitable substrate engagement member comprises at least three interdigitable substrate engagement members;
wherein the CVD coating is selected from the group consisting of graphene and boron nitride.

4. The method of claim 3 wherein said base member has a semicylindrical shape.

5. In a method for synthesizing a thin film using chemical vapor deposition, said method comprising the steps of heating a substrate, depositing a thin film onto a surface of the substrate by exposing the substrate to chemical vapor deposition, and cooling the substrate to room temperature, the improvement comprising, providing prior to said heating step a substrate support assembly comprising at least two selectively interdigitable substrate support fixtures, loading the substrate onto said at least two fixtures, and interdigitating said at least two fixtures, the improvement further comprising unloading the substrate from said at least two fixtures subsequent to said deposition step;
wherein each of said at least two fixtures comprises a base member and at least one interdigitable substrate engagement member;
wherein said at least one interdigitable substrate engagement member comprises at least three interdigitable substrate engagement members;
wherein the thin film is selected from the group consisting of graphene and boron nitride.

6. The method of claim 5 wherein said base member has a semicylindrical shape.

* * * * *